United States Patent
Demadrille et al.

(10) Patent No.: US 8,277,599 B2
(45) Date of Patent: Oct. 2, 2012

(54) COMPOUNDS FOR PLACING OBJECTS BY SELF ASSEMBLING AND THE USE THEREOF

(75) Inventors: Renaud Demadrille, St Egrève (FR); Stéphane Guillerez, Lépin le Lac (FR)

(73) Assignee: Commissariat a L'Energie Atomique, Paris (FR)

(*) Notice: Subject to any disclaimer, the term of this patent is extended or adjusted under 35 U.S.C. 154(b) by 1142 days.

(21) Appl. No.: 11/916,392

(22) PCT Filed: Jun. 12, 2006

(86) PCT No.: PCT/FR2006/001323
§ 371 (c)(1),
(2), (4) Date: Jun. 17, 2008

(87) PCT Pub. No.: WO2006/134260
PCT Pub. Date: Dec. 21, 2006

(65) Prior Publication Data
US 2009/0130487 A1    May 21, 2009

(30) Foreign Application Priority Data
Jun. 15, 2005   (FR) ...................... 05 06088

(51) Int. Cl.
C04B 37/00 (2006.01)
B41J 2/16 (2006.01)
B32B 9/04 (2006.01)
C07D 239/02 (2006.01)

(52) U.S. Cl. ......... 156/325; 156/326; 428/704; 544/323

(58) Field of Classification Search .................. 156/325, 156/326; 428/704; 544/323
See application file for complete search history.

(56) References Cited

U.S. PATENT DOCUMENTS
5,383,993 A * 1/1995 Katada et al. ................. 156/153
6,190,778 B1 * 2/2001 Batz-Sohn et al. ........... 428/448

FOREIGN PATENT DOCUMENTS
DE       102 38 587 A1    11/2003
(Continued)

OTHER PUBLICATIONS

Dawson, et al, Molecular Recognition at a Monolayer Interface, 2,4-Diaminopyrimidine-Succinimide Host-Guest Partners, Chapter 15, Department of Polymer Science and Engineering, University of Massachusetts, Amherst, MA 01003, Eastman Kodak Company, Rochester, NY 14650, Department of Chemistry, Polytechnic University Brooklyn, NY 11201, © 1996 American Chemical Society.

(Continued)

*Primary Examiner* — Michael Orlando
(74) *Attorney, Agent, or Firm* — Miller, Matthias & Hull LLP

(57) ABSTRACT

The inventive method for placing and fixing (bonding) a first object, whose surface is functionalized by compounds of formula I Y (X), A' (I), on the surface of a second object whose surface is functionalized by compounds of formula II Y (X)$_n$ A (II), wherein A and A' are functional groups enabling to be bonded at least by a link in a covalent manner to an object surface X and X' are aliphatic, linear, branched or cyclic spacers which can comprise one or several hetero or aromatic, or heteroaromatic atoms or consist of several aromatic or heteroaromatic cycles and optionally of alternating aliphatic chains having aromatic or heteroaromatic groups, n and n'=0 or 1 and Y and Y are functions for generating one or several non-covalent bonds wherein said Y or Y' are selected such that they are complementary or can complex a metal atom or an identical metal compound.

7 Claims, 2 Drawing Sheets

FOREIGN PATENT DOCUMENTS

Figure 2:
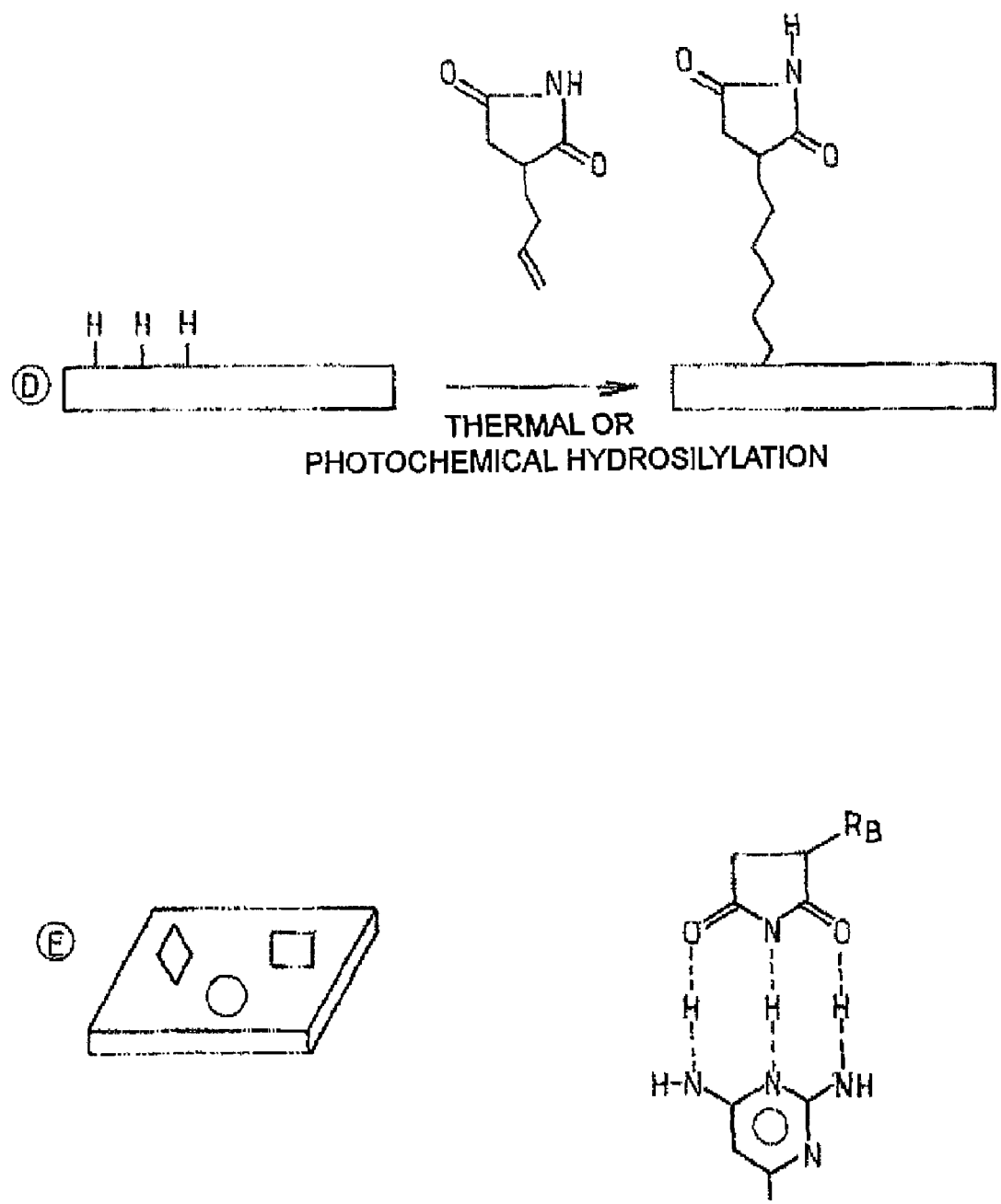

DE    102 37 280 A1    3/2004
WO    WO 98/28320      7/1998
WO    WO 2004/099107   11/2004

OTHER PUBLICATIONS

Erez Braun, DNA-templated assembly and electrode attachment of a conducting silver wire, Department of Physics, Department of Chemistry, Solid State Institute, Technion-Israel Institute of Technology, Haifa 32000, Israel, Nature vol. 391, Feb. 19, 1998.

INPI, French Preliminary Search Report, EPO Form P0465, No. 12/82, May 24, 2006.

International Search Report, European Patent Office, Form PCT/ISA/210, Oct. 3, 2006.

* cited by examiner

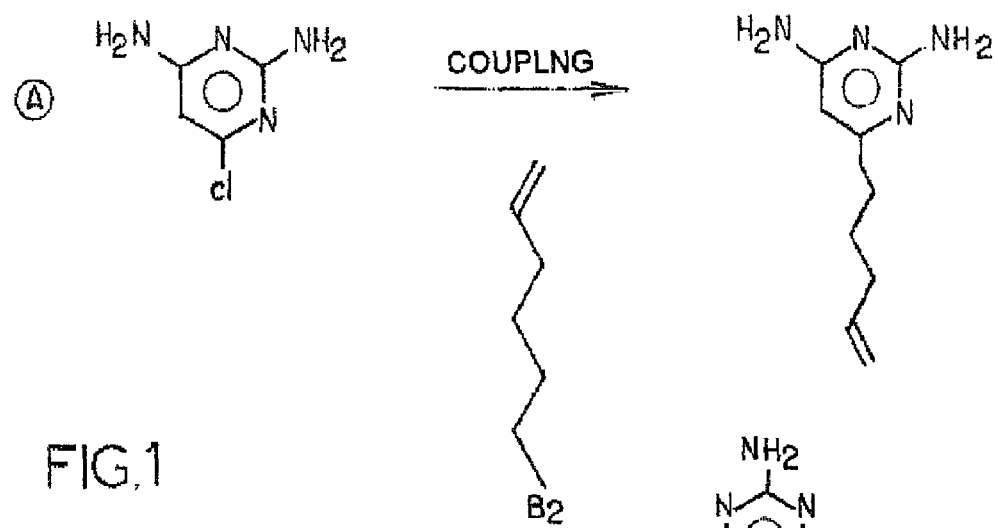
FIG.1
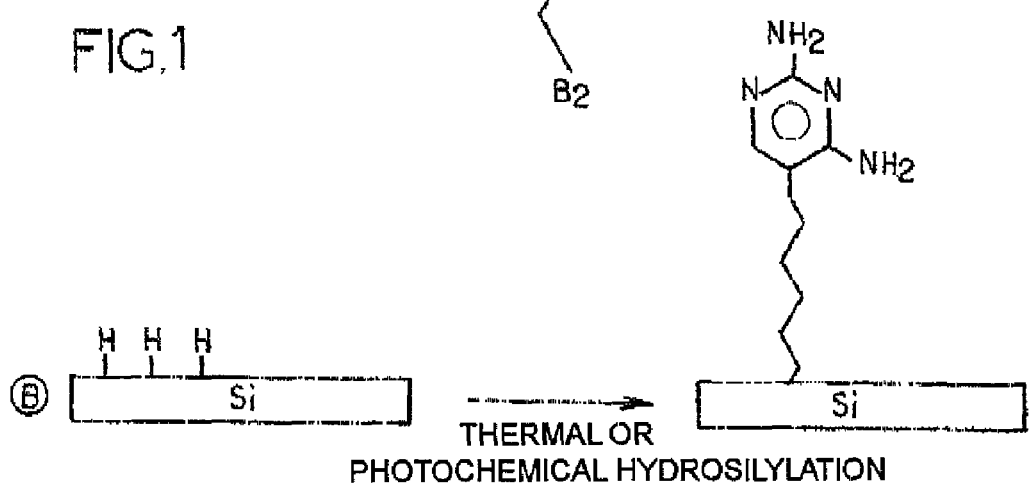
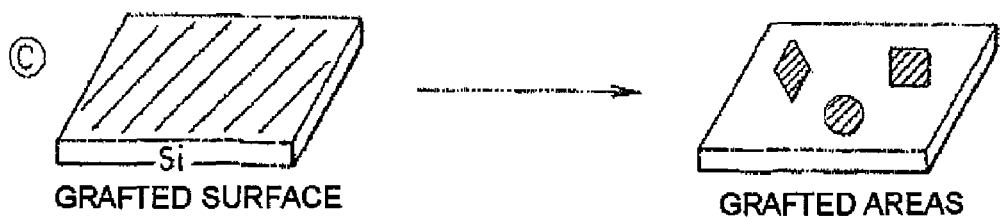

COMPOUNDS FOR PLACING OBJECTS BY SELF ASSEMBLING AND THE USE THEREOF

CROSS-REFERENCE TO RELATED APPLICATION

This is the U.S. National Phase of International Application No. PCT/FR2006/001323 filed 12 Jun. 2006, which claims priority to French Patent Application No. FR 05 06088 filed 15 Jun. 2005, the entire disclosures of which is incorporated herein by reference.

FIELD OF THE DISCLOSURE

The present invention relates to novel molecules capable of bonding to a surface by means of at least one covalent bond and comprising a functional group which allows them to associate, by means of at least one bond of noncovalent type, with an object or a surface functionalized with a molecule having a complementary functional group, and to uses thereof.

BACKGROUND OF THE DISCLOSURE

The miniaturization of devices in fields as varied as electronics, biological engineering and microfluidic devices requires increasingly precise fabrication processes. In the nanotechnology and molecular electronics fields, the precision with which the devices are fabricated requires the placement of the various elements to be controlled on a nanometric scale.

Conventional technologies for the fabrication of such devices use assemblies by placement of the various elements by means of robots. However, the increasing miniaturization of the components no longer makes it possible to efficiently use technologies derived from conventional robotics. This is because, for devices and objects less than about a hundred nanometers in size, the capillary forces are generally greater than the gravitational forces, which makes the placing of the components by robot manipulators very difficult.

The new techniques based on self-assembly mechanisms may potentially make it possible to overcome the problems encountered when placing is carried out using robots. These techniques are based on a "fluidic" approach which makes it possible to place electronic devices on flat surfaces by involving motor forces such as shape recognition, capillary forces or hydrophilic-hydrophobic interactions (Zheng, Adv. Funct. Mater. 2005, 15, 5).

Moreover, the functionalization of surfaces with organic molecules in order to modify the properties thereof is a field of research in which there is growing interest with the emergence of nanotechnologies. Mention may, for example, be made of the review by Whitesides (Self-Assembled Monolayers of Thiolates on Metals as a Form of Nanotechnology: Chem., Rev. 2005, 105, 1103-1169) which gives an overview of the prior art in this field. Surface modifications by grafting of organic molecules make it possible, for example, to confer a hydrophilic, hydrophobic or ionic nature on the grafted surface and to thus bring into play forces of attraction or repulsion in order to place correctly functionalized objects. The placement is directed by the tendency of the system to want to reduce the energy at the interface.

The modification of other surfaces which are of particular interest in electronics has also been studied, and mention will be made, in this field, of the review by Buriak (Organometallic Chemistry on Silicon and Germanium Surfaces Chem. Rev. 2002, 102, 1271-1308).

Similarly, the structuring of surfaces is a well known field of research and the techniques of the art are widely employed for the fabrication of devices (Patterning Self-assembled Monolayers, Progress in Surface Science, 75 (2004), 1-68).

The use of techniques which have recourse to chemical recognition or self-assembly mechanisms for the fabrication of devices is recent. WO-A-96/30508 describes the functionalization of surfaces with polymers and the use of these modified surfaces in order to assemble them with other surfaces by adjusting chemical affinities. However, this technique reports the difficulty in designing polymers of controlled molecular mass in order to conserve solubility and easy use.

EP-A-0 943 158 describes the use of the self-assembly of complementary DNA strands for the fabrication of devices for photonic and electronic applications.

This technique enables the placement and fixing of surfaces functionalized with complementary DNA strands capable of hybridizing by biological self-assembly mechanisms. This approach is also developed in US 2004/0115696. However, this technique requires activation of the surface in order to make it compatible with the DNA strand that is intended to be deposited thereon so as to be able to subsequently hybridize it.

The various approaches reported above do not, however, make it possible to control the assembly forces that are involved.

In addition, the systems in the literature are not described as being reversible.

Now, the reversibility of the interaction between the two molecular species involved in the assembly process is the determining factor which allows the "surface+object" combination to find its optimal position which corresponds to the maximum number of binding interactions permitted by parameters such as the size and the shape of the objects, the size and the shape of the areas of the surface that are grafted with the molecules capable of recognition, the surface concentrations of molecules capable of self-assembling on the object and on the surface (or on a clearly delimited area of this surface), etc.

It would therefore be desirable to have a process for assembling objects in precise positions on surfaces, in particular in the fields of electronics, biological engineering, microelectronics, photonics, optoelectronics, optics or microfluidic devices.

It would also be desirable to have compounds, preferably of small size, advantageously soluble or sublimatable, that can be grafted to the surface of objects, typically between 1 μm and 1 mm, so as to functionalize them such that these objects are capable of self-assembling and that the self-assembly forces involved are controllable and entirely adjustable.

It would also be desirable to have compounds that allow a reversible interaction with the other compound involved in the assembly process.

Now, after extensive research, the applicant has discovered, surprisingly, a method for placing and fixing (bonding) an object to the surface of another object that is satisfactory.

This placing and fixing method involves multiple molecular interactions between the surface of the first object and the surface of the second object, each of the surfaces advantageously bearing compounds having parts (groups) capable of recognizing one another.

For this reason, a subject of the present application is a method for placing and fixing (bonding) a first object, whose surface is functionalized with compounds, preferably small in size, of formula I

   (I)

on the surface of a second object, whose surface is functionalized with compounds, preferably small in size, of formula II

   (II)

in which:

A and A' are independently functional groups which make it possible to bond, at least by one covalent bonding, to the surface of a given object, X and X' are independently aliphatic, in particular linear, branched or cyclic spacers which may comprise one or more heteroatoms, or aromatic or heteroaromatic spacers, or which may consist of several aromatic or heteroaromatic rings and optionally consist of aliphatic chains alternating with aromatic or heteroaromatic groups, n and n' independently have the value 0 or 1, Y and Y' are independently functions capable of generating one or more bonds of noncovalent type, Y and Y' being selected such that they are complementary, i.e. allow the creation of one or more noncovalent bonds, or being selected such that they can complex a metal atom or an identical metal compound.

X and X' are, for example, a divalent radical derived from a $C_1$ to $C_{20}$ alkyl, $C_2$ to $C_{20}$ alkenyl, $C_2$ to $C_{20}$ alkynyl, oxo, cyano-($C_1$ to $C_{20}$ alkyl), heterocyclyloxy, $C_1$ to $C_{20}$ alkyloxy, $C_1$ to $C_{10}$ alkylthio, ($C_1$ to $C_{20}$ alkyl)carbonyl, $C_3$ to $C_{12}$ cycloalkyl, aryl, $C_1$ to $C_{20}$ haloalkyl, heterocyclyl, $C_3$ to $C_{12}$ cycloalkenyl, aryl-($C_1$ to $C_{20}$ alkyl), heterocyclyl-($C_1$ to $C_{20}$ alkyl), $C_2$ to $C_{20}$ acyl, ($C_1$ to $C_{10}$ alkylthio)-($C_1$ to $C_{20}$ alkyl), $C_1$ to $C_{10}$ hydroxyalkyl, $C_1$ to $C_{10}$ alkoxycarbonyl, arylcarbonyl, aryl-($C_1$ to $C_{20}$ alkyl)carbonyl, aryl-($C_2$ to $C_{20}$ alkenyl), ($C_1$ to $C_{10}$ alkoxy)-($C_1$ to $C_{20}$ alkyl) aryl-($C_1$ to $C_{10}$ thioalkyl), aryloxy-($C_1$ to $C_{20}$ alkyl), aryl-($C_1$ to $C_{10}$ alkylthio)-($C_1$ to $C_{10}$ alkyl), aryl-($C_1$ to $C_{10}$ alkoxy)-($C_1$ to $C_{20}$ alkyl), ($C_1$ to $C_{10}$ alkoxy)aryl-($C_1$ to $C_{10}$ alkoxy)-($C_1$ to $C_{20}$ alkyl), ($C_1$ to $C_{10}$ alkoxy)carbonyl-($C_1$ to $C_{20}$ alkyl), aminocarbonyl, aminocarbonyl-($C_1$ to $C_{20}$ alkyl), ($C_1$ to $C_{20}$ alkyl)aminocarbonyl, N-arylaminocarbonyl, N—($C_1$ to $C_{20}$ alkyl)-N-arylaminocarbonyl, ($C_1$ to $C_{20}$ alkyl)aminocarbonylalkyl, carboxy-($C_1$ to $C_{20}$ alkyl), $C_1$ to $C_{20}$ alkylamino, N-arylamino, N-aryl-($C_1$ to $C_{20}$ alkylamino), N—($C_1$ to $C_{20}$ alkyl)-N-aryl-($C_1$ to $C_{20}$ alkylamino), N—($C_1$ to $C_{20}$ alkyl)-N-arylamino, amino-($C_1$ to $C_{20}$ alkyl), ($C_1$ to $C_{20}$ alkyl)amino-($C_1$ to $C_{20}$ alkyl)-N-arylamino-($C_1$ to $C_{20}$ alkyl), N-aryl-($C_1$ to $C_{20}$ alkyl)amino-($C_1$ to $C_{20}$ alkyl), N—($C_1$ to $C_{20}$ alkyl)-N-aryl-($C_1$ to $C_{20}$ alkylamino)-($C_1$ to $C_{20}$ alkyl), N—($C_1$ to $C_{20}$ alkyl)-N-arylamino-($C_1$ to $C_{20}$ alkyl), aryloxy, aryl-($C_1$ to $C_{10}$ alkoxy), arylthio, aryl-($C_1$ to $C_{10}$ alkylthio), $C_1$ to $C_{10}$ alkylsulfinyl, $C_1$ to $C_{20}$ alkylsulfonyl, aminosulfonyl, $C_1$ to $C_{20}$ alkylaminosulfonyl, N-arylaminosulfonyl, arylsulfonyl or N—($C_1$ to $C_{20}$ alkyl)-N-arylaminosulfonyl.

When X and X' are heterocyclic spacers, they are, for example, a 5- or 6-membered partially unsaturated heterocyclyl, a 5- or 6-membered unsaturated heterocyclyl, a 9- or 10-membered unsaturated condensed heterocyclyl, a lower cycloalkenyl or phenyl, and in particular an oxazolyl, isoxazolyl, thienyl, furyl, dihydrofuryl, pyrrolyl, pyrazolyl, thiazolyl, phenyl, isothiazolyl, benzofuryl, cyclopentenyl, cyclopentadienyl or pyridyl.

X and X' can in particular be an aliphatic chain that may contain one or more heteroatoms and, optionally, functional or nonfunctional side groups. This aliphatic chain may have one or more of its hydrogen atoms replaced with halogen atoms, such as iodine, and preferably bromine or chlorine, or deuteriums.

X and X' are most particularly an aliphatic chain.

When X or X' comprises a $C_1$ to $C_{20}$ alkyl, this alkyl is preferably $C_1$ to $C_{15}$, advantageously $C_1$ to $C_{12}$, especially $C_1$ to $C_{10}$, particularly $C_1$ to $C_8$, most particularly $C_1$ to $C_5$, and linear, or branched. X is in particular a divalent radical derived from a methyl, ethyl, isopropyl, butyl, tert-butyl, isobutyl or pentyl.

When X or X' comprises a $C_2$ to $C_{20}$ alkenyl or, alkynyl, this alkenyl or alkynyl is preferably $C_2$ to $C_{15}$, advantageously $C_2$ to $C_{12}$, especially $C_2$ to $C_{10}$, particularly $C_2$ to $C_8$, most particularly $C_2$ to $C_5$, and linear or branched.

When X or X' comprises at least one heteroatom, they advantageously comprise from 1 to 4, preferably from 1 to 3, especially 1 or 2, most particularly just one heteroatom(s). The heteroatom (or the heteroatoms) is (are) selected from sulfur, nitrogen, oxygen and preferably one of the last two.

X and X' preferably represent an alkyl radical, and particularly an octyl or hexyl radical, which is especially linear.

The functional groups A and A' are selected according to the surface to be functionalized, in accordance with the known teachings for surface functionalization (Patterning Self-assembled Monolayers, Progress in Surface Science, 2004, 75, 1-68; Whitesides, Self-Assembled Monolayers of Thiolates on Metals as a form of Nanotechnology: Chem. Rev. 2005, 105, 1103-1169).

A and A' preferably represent a radical capable of creating one or more covalent bonds with surface silicon atoms, and in particular a vinyl radical.

Y and Y' are functions capable of generating one or more bonds of noncovalent type, and preferably bonds of hydrogen type. Use will be made of at least one of the functions of this noncovalent type that are well known in the literature (Supramolecular Assembly via Hydrogen Bonds II, Structure and Bonding vol. 108, Supramolecular Assembly via Hydrogen Bonds II, Structure and Bonding vol. 111, D. M. P. Mingos, Springer Verlag Berlin Heidelberg New York; Molecular Self-Assembly, Organic vs. Inorganic Approaches, Structure and Bonding vol. 96, M. Fujita, Springer Verlag Berlin Heidelberg New York).

Y preferably represents a heterocyclic radical capable of generating at least one hydrogen bond, and particularly a diaminopyrimidyl radical.

Y' may also be a heterocyclic group, but must be capable of generating at least one hydrogen bond with Y, and, particularly if Y is a diaminopyrimidyl radical, then Y' may be a 1,3-dioxoindole radical All the noncovalent interactions known to those skilled in the art can be used in the invention, and among these, in particular hydrogen bonds and interactions with a metal atom or an identical metal compound. The metal atom is, for example, indium or a metal compound containing for example indium.

An example of a couple: functional group Y and functional group Y' which are complementary, so as to allow the creation of noncovalent bonds of hydrogen type, is for example the couple 2,6-diaminopyrimidine and 1,3-dioxoisoindole (maleimide) establishing 3 hydrogen bonds (two amino-oxo and one azo-azo).

The term "compounds that are small in size" is intended to mean a compound of molecular mass advantageously less than 3000 g·mol$^{-1}$, preferably less than 500 g·mol$^{-1}$.

The objects whose surface can be functionalized with the compounds of formulae I and II are, for example:

for objects S1, for example, electronic devices, preferably microelectronic devices, such as thin chips of integrated circuits (for example, in electronics for controlling a microsystem) of the order of a mm$^2$, in particular optoelectronic devices, particularly AsGa vignettes;

for objects S2, for example, electronic devices, preferably microelectronic devices, especially optoelectronic devices, particularly silicon wafers.

These objects are typically between 1 μm and 1 mm in size.

Under preferred conditions for implementation of the method described above, firstly, a compound of formula I is reacted with an object S1 and a compound of formula II is reacted with an object S2.

The functionalization of the surface of the object S1 and then the functionalization of the surface of the object S2 are carried out using the techniques known to those skilled in the art. More particularly, if the objects S1 and S2 are silicon substrates, then A and A' capable of creating one or more covalent bonds with the surface silicon atoms will be selected, and A and A' will in particular be vinyl radicals.

The functionalizations of S1 and S2 will particularly be carried out by hydrosilylation reactions, and more particularly thermal or photochemical hydrosilylation reactions.

At this stage, two objects (S1 and S2) whose surfaces are functionalized with molecules comprising a group Y' and Y, respectively, where Y and Y' are capable of generating between them at least one bond of hydrogen type, have been provided.

The compounds of formulae I and II above have very advantageous properties and qualities. They comprise at least one function which makes it possible to graft them covalently to a given substrate and which also comprises at least one functional group which makes it possible to create at least one noncovalent bond with a compound having at least one complementary functional group.

The method of the invention allows the placement, precise orientation and fixing of a given number of objects of nanometric to micrometric size at the surface of a substrate.

By modifying the chemical nature of the functional groups Y and Y' capable of creating one or more bonds of noncovalent type (for example, hydrogen bonds), it is possible to readily modulate the assembly forces. Control is also possible by modulating the surface concentration of functional groups Y and Y' capable of generating noncovalent bonds, ideally of hydrogen type, on the surfaces, for example by dilution within the layer or by increasing the size of the groups for bonding to the surface (A and A').

The dilution of functional groups Y (or Y') within the layer can be carried out by diluting the compound A-Xn—Y (or A'—X'n'—Y') by mixing with a molecule of type A-Xn or A-X'n' (not containing a function capable of creating noncovalent bonds) during the functionalization of the surfaces.

This technique makes it possible to precisely modulate the assembly forces by adjusting the ratio between the molecules having a group Y or Y' and the molecules which do not have any.

The assembly forces can also be modulated by varying the surface concentration of function Y and Y' by varying the size of the groups for bonding to the surface (A and A'). The larger the size of the bonding group, the fewer molecules it will be possible to have on the surface and the fewer functions of type Y and Y' there will be for generating noncovalent bonds.

The advantage of the use of bonds of this type compared with the literature lies in particular in the reversibility of the assembly process between the two objects S1 and S2.

The assembly forces involved can also be modulated by dilution, i.e. by varying the number of groups Y' on S1 and Y on S2 (concentration of molecules A-(X)$_n$—Y and A'-(X)$_{n'}$—Y' on the surfaces). Finally, the forces of attraction can be modulated according to the number of hydrogen bonds that may possibly be created between the complementary groups Y and Y' The various approaches and the choice of the functional groups that make it possible to modulate the assembly forces are presented on pages 3-31 and pages 64-93 of Molecular Self-Assembly, Organic vs. Inorganic Approaches. Structure and Bonding vol. 96, M. Fujita, Springer Verlag Berlin Heidelberg New York.

The compounds of formulae I and II above also have the advantage that they can be placed precisely on the surfaces by means of other techniques known in the field (fountain pen nanolithography, nanoprinting, CVD, liquid grafting, etc.). These various techniques are listed in the review (Patterning Self-Assembled Monolayers, Progress in Surface Science, 75 (2004), 1-68). The grafted surfaces according to the invention of the objects S1 and S2 can be readily structured by the techniques known in the literature.

The same surface can, in addition, be functionalized with various molecules A-(X)$_n$—Y and A'-(X)$_{n'}$—Y' so as to allow the placing of various functionalized surfaces by means of specific molecular recognitions.

The method of the invention thus makes it possible to place objects with functionalized surfaces that may be small in size (in particular micrometric or even nanometric in size) on objects with a functionalized surface of a support such as a wafer. This method finds applications in many fields, such as, for example, the fields of microelectronics, biology, optoelectronics, etc.

By way of more particular example of application, mention may be made of the following:

in the optoelectronics field, the use of the method of the invention for placing vignettes, for example AsGa vignettes (for preparing photodiodes), with dimensions of approximately 200 μm×200 μm and with a thickness of 50 μm, on wafers, in the microelectronics field, the use of the method of the invention for placing thin chips of integrated circuits (for example, electronics for controlling a microsystem) of the order of 1 mm$^2$ and with a thickness of approximately 50 μm, on wafers.

Moreover, the method of the invention makes it possible to control the forces of assembly between each functionalized surface of an object and the functionalized surface of the support on which the object must be placed. It is thus possible, using the same support, to adjust the forces of assembly between the various objects and their support according to the intended applications, it being possible for these forces to then be identical for the various objects or different.

In order to control these assembly forces, it is in particular possible, as described above, to vary the concentration of group Y and Y' associated with the surfaces to be assembled, or alternatively to vary the number of noncovalent bonds between these groups Y and Y'.

Finally, the reversibility of the interactions between Y and Y' also makes it possible to regenerate the functionalized surfaces and to free the fixed surfaces, either because errors of location of objects have been detected, or because some of the fixed objects do not or no longer perform their function(s).

These properties are illustrated hereinafter in the experimental section. They justify the use of the compounds of formulae I and II and of the methods described above, for example in the installation of AsGa vignettes on silicon wafers for applications in optoelectronics and in particular for the fabrication of diodes. The placement of the objects S1 and S2 with respect to one another can be roughly carried out mechanically (transfer arm) or by fluidics (in solution); the precise positioning is made possible by the molecular recognition between Y' and Y.

The invention also relates to the use of compounds of formulae I and II above for the placing, orienting and fixing of functionalized objects on functionalized surfaces.

The method for placing and fixing (bonding) an object on a surface according to the invention is advantageously implemented in the fields of electronics, biological engineering, microfluidic devices, microelectronics, photonics, optoelectronics and optics. It is preferably not implemented in the field of medical diagnosis.

The subject of the present application is also the novel compounds of formulae I and II described above.

Finally, the present application is directed toward the objects S1 whose surface is functionalized with compounds A-$(X)_n$—Y and the objects S2 whose surface is functionalized with compounds A'-$(X)_{n'}$—Y', described above, and also the combined objects comprising the objects S1 and S2 noncovalently bound by the compounds A-$(X)_n$—Y and A'-$(X)_{n'}$—Y' described above.

The preferred conditions for implementation of the methods described above also apply to the other objects of the invention targeted above, in particular to the compounds of formula I and of formula II and to the uses thereof.

The examples which follow illustrate the present application.

The invention will also be understood more clearly if reference is made to the attached drawings in which:

FIG. 1 represents the preparation of a compound of formula I or II (stage A), the functionalization of the surface of a first object with this compound (stage B), the functionalization of the surface of a second object with a complementary compound of formula II or I (stage D), the surface of a first object having its entire surface as on the left or 3 functionalized areas of specific size and shape as on the right (stage C), FIG. 2 (on the left) represents the composite formed between the first and the second object, hydrogen bonds allowing the coupling of the objects (on the right).

DETAILED DESCRIPTION

Example 1

Surface Functionalization of Silicon Wafers and of Inorganic Semiconductors with a Silicon Surface A silicon wafer S1 and an inorganic semiconductor, S2 are treated with a 2% solution of hydrofluoric acid for 1 minute.

The silicon wafer S1 is placed in a glass tube with a large molar excess of compound of formula II where A is a vinyl radical and Y is a diaminopyrimidine group (see FIG. IB). The tube is then heated at 200° C. for 2 h under argon. The silicon wafer is then removed and rinsed with various solvents (ether, pentane, dichloromethane, etc.). After having been subjected to ultrasound for 5 minutes in dichloromethane, the piece is removed and then dried under argon.

The functionalization of an inorganic semiconductor S2 is carried out in the same manner with a large molar excess of compound of formula I where A is a vinyl radical and Y' is a maleimide group (see FIG. ID).

Example 2

Placement of an Inorganic Semiconductor S2 on a Silicon Wafer S1

The wafer and the inorganic semiconductor were assembled by mechanical placement in an appropriate solvent with agitation as described by Zheng, Adv. Funct. Mater. 2005, 15, 5. The self-assembly takes place by virtue of three hydrogen bonds (see FIG. II).

The same process was carried out with two silicon wafers.

The invention claimed is:

1. A process for joining, placing and fixing a first object on a second object using binding molecules, wherein at least one of the first and second objects is a silicon substrate, comprising:

applying a binding molecule of formula I $$Y'—(X')_{n'}—A' \qquad (I)$$

on a surface of the first object,
applying a binding molecule of formula II $$Y—(X)_n—A \qquad (II)$$

on a surface of the second object, wherein:

A and A' are independently functional groups which make it possible to bond, at least by one covalent bonding, to the surface of a given object, wherein A and A' are radicals capable of forming covalent bonds with surface silicon atoms on the first and second objects and, wherein at least one of A and A' is a vinyl radical, X and X' are independently aliphatic, linear, branched or cyclic spacers which may comprise one or more heteroatoms, or aromatic or heteroaromatic spacers, or which may consist of several aromatic or heteroaromatic rings and optionally consist of aliphatic chains alternating with aromatic or heteroaromatic groups, n and n' independently have the value 0 or 1, Y and Y' are independently functions capable of generating one or more bonds of noncovalent type, Y and Y' being selected such that they are complementary to allow the creation of one or more noncovalent bonds, or being selected such that they can complex a metal atom or an identical metal compound; and bringing the first and second objects into contact with each other so that Y and Y' are associated with each other through the one or more bonds of noncovalent type.

2. The process as claimed in claim 1, wherein X and X' are independently a divalent radical derived from a $C_1$ to $C_{20}$ alkyl, $C_2$ to $C_{20}$ alkenyl, $C_2$ to $C_{20}$ alkynyl, oxo, cyano-($C_1$ to $C_{20}$ alkyl), heterocyclyloxy, $C_1$ to $C_{20}$ alkyloxy, $C_1$ to $C_{10}$ alkylthio, ($C_1$ to $C_{20}$ alkyl)carbonyl, $C_3$ to $C_{12}$ cycloalkyl, aryl, $C_1$ to $C_{20}$ haloalkyl, heterocyclyl, $C_3$ to $C_{12}$ cycloalkenyl, aryl-($C_1$ to $C_{20}$ alkyl), heterocyclyl-($C_1$ to $C_{20}$ alkyl), $C_2$ to $C_{20}$ acyl, ($C_1$ to $C_{10}$ alkylthio)-($C_1$ to $C_{20}$ alkyl), $C_1$ to $C_{10}$ hydroxyalkyl, $C_1$ to $C_{10}$ alkoxycarbonyl, arylcarbonyl, aryl-($C_1$ to $C_{20}$ alkyl)carbonyl, aryl-($C_2$ to $C_{20}$ alkenyl), ($C_1$ to $C_{10}$ alkoxy)-($C_1$ to $C_{20}$ alkyl), aryl-($C_1$ to $C_{10}$ thioalkyl), aryloxy-($C_1$ to $C_{20}$ alkyl), aryl-($C_1$ to $C_{10}$ alkylthio)-($C_1$ to $C_{10}$ alkyl), aryl-($C_1$ to $C_{10}$ alkoxy)-($C_1$ to $C_{20}$ alkyl), ($C_1$ to $C_{10}$ alkoxy) aryl-($C_1$ to $C_{10}$ alkoxy)-($C_1$ to $C_{20}$ alkyl), ($C_1$ to $C_{10}$ alkoxy) carbonyl-($C_1$ to $C_{20}$ alkyl), aminocarbonyl, aminocarbonyl-($C_1$ to $C_{20}$ alkyl), ($C_1$ to $C_{20}$ alkyl)aminocarbonyl, N-arylaminocarbonyl, N—($C_1$ to $C_{20}$ alkyl)-N-arylaminocarbonyl, ($C_1$ to $C_{20}$ alkyl)aminocarbonylalkyl, carboxy-($C_1$ to $C_{20}$ alkyl), $C_1$ to $C_{20}$ alkylamino, N-arylamino, N-aryl-($C_1$ to $C_{20}$ alkylamino), N—($C_1$ to $C_{20}$ alkyl)-N-aryl-($C_1$ to $C_{20}$ alkylamino), N—($C_1$ to $C_{20}$ alkyl)-N-arylamino, amino-($C_1$ to $C_{20}$ alkyl), ($C_1$ to $C_{20}$ alkyl)amino-($C_1$ to $C_{20}$ alkyl), N-aryl-amino-($C_1$ to $C_{20}$ alkyl), N-aryl-($C_1$ to $C_{20}$ alkyl) amino-($C_1$ to $C_{20}$ alkyl), N—($C_1$ to $C_{20}$ alkyl)-N-aryl-($C_1$ to $C_{20}$ alkylamino)-($C_1$ to $C_{20}$ alkyl), N—($C_1$ to $C_{20}$ alkyl)-N-arylamino-($C_1$ to $C_{20}$ alkyl), aryloxy, aryl-($C_1$ to $C_{10}$ alkoxy), arylthio, aryl-($C_1$ to $C_{10}$ alkylthio), $C_1$ to $C_{10}$ alkylsulfinyl, $C_1$ to $C_{20}$ alkylsulfonyl, aminosulfonyl, $C_1$ to $C_{20}$ alkylaminosulfonyl, N-arylaminosulfonyl, arylsulfonyl or N—($C_1$ to $C_{20}$ alkyl)-N-arylaminosulfonyl.

3. The process as claimed in claim 1, wherein X and X' are independently an aliphatic chain that may contain one or more heteroatoms and, optionally, functional or nonfunctional side groups, one or more of the hydrogen atoms of said aliphatic chain being optionally replaced with halogen atoms.

4. The process as claimed in claim 1, wherein X and X' represent a $C_1$ to $C_{20}$ alkyl radical.

5. The process as claimed in claim 1, wherein the compounds of formulae I and II have a molecular mass of less than 3000.

6. The process as claimed in claim 1, wherein the first object and the second object are thin chips of integrated circuits selected from a group consisting of AsGa vignettes and silicon wafers.

7. The process as claimed in claim 1, wherein Y and Y' are functions capable of generating one or more hydrogen bonds.

* * * * *